(12) United States Patent
Shinagawa et al.

(10) Patent No.: US 9,279,869 B2
(45) Date of Patent: Mar. 8, 2016

(54) NMR PROBE

(71) Applicant: JEOL Resonance Inc., Tokyo (JP)

(72) Inventors: Hideyuki Shinagawa, Ibaraki (JP); Tadashi Shimizu, Ibaraki (JP); Shinobu Ohki, Ibaraki (JP); Takahiro Nemoto, Tokyo (JP); Eijiro Baba, Tokyo (JP); Katsuya Hioka, Tokyo (JP)

(73) Assignee: JEOL Resonance Inc., Tokyo (JP)

( * ) Notice: Subject to any disclaimer, the term of this patent is extended or adjusted under 35 U.S.C. 154(b) by 448 days.

(21) Appl. No.: 13/765,852

(22) Filed: Feb. 13, 2013

(65) Prior Publication Data
US 2013/0207656 A1 Aug. 15, 2013

(30) Foreign Application Priority Data
Feb. 14, 2012 (JP) .................... 2012-029281

(51) Int. Cl.
*G01V 3/00* (2006.01)
*G01R 33/30* (2006.01)

(52) U.S. Cl.
CPC .............. *G01R 33/30* (2013.01); *G01R 33/307* (2013.01)

(58) Field of Classification Search
CPC .................................................. G01R 33/307
USPC ................................................... 324/321, 318
See application file for complete search history.

(56) References Cited

U.S. PATENT DOCUMENTS

| 5,146,166 | A | * | 9/1992 | Bartuska | 324/321 |
| 5,534,780 | A | * | 7/1996 | Lilly | 324/321 |
| 5,952,831 | A | * | 9/1999 | Yamakoshi et al. | 324/321 |
| 7,282,919 | B2 | | 10/2007 | Doty et al. | |
| 7,718,135 | B2 | * | 5/2010 | Himmelsbach et al. | 422/527 |
| 8,217,655 | B2 | * | 7/2012 | De Vries et al. | 324/321 |

FOREIGN PATENT DOCUMENTS

| JP | 5759356 A | 9/1955 |
| JP | 2003177172 A | 6/2003 |

* cited by examiner

*Primary Examiner* — Louis Arana
(74) *Attorney, Agent, or Firm* — The Webb Law Firm

(57) ABSTRACT

An NMR probe has a sample tube insertion port for introducing and withdrawing the sample tube into and from the probe, a sample tube support providing support of the sample tube during NMR measurements, a tubular sample tube passage connecting together the sample tube insertion port and the sample tube support and capable of transporting the sample tube between them, and a gas stream generator for producing a gas stream in the sample tube passage to move the sample tube between the sample tube insertion port and the tube support. The gas stream generator is mounted at an intermediate (non-end) position in the sample tube passage.

7 Claims, 6 Drawing Sheets

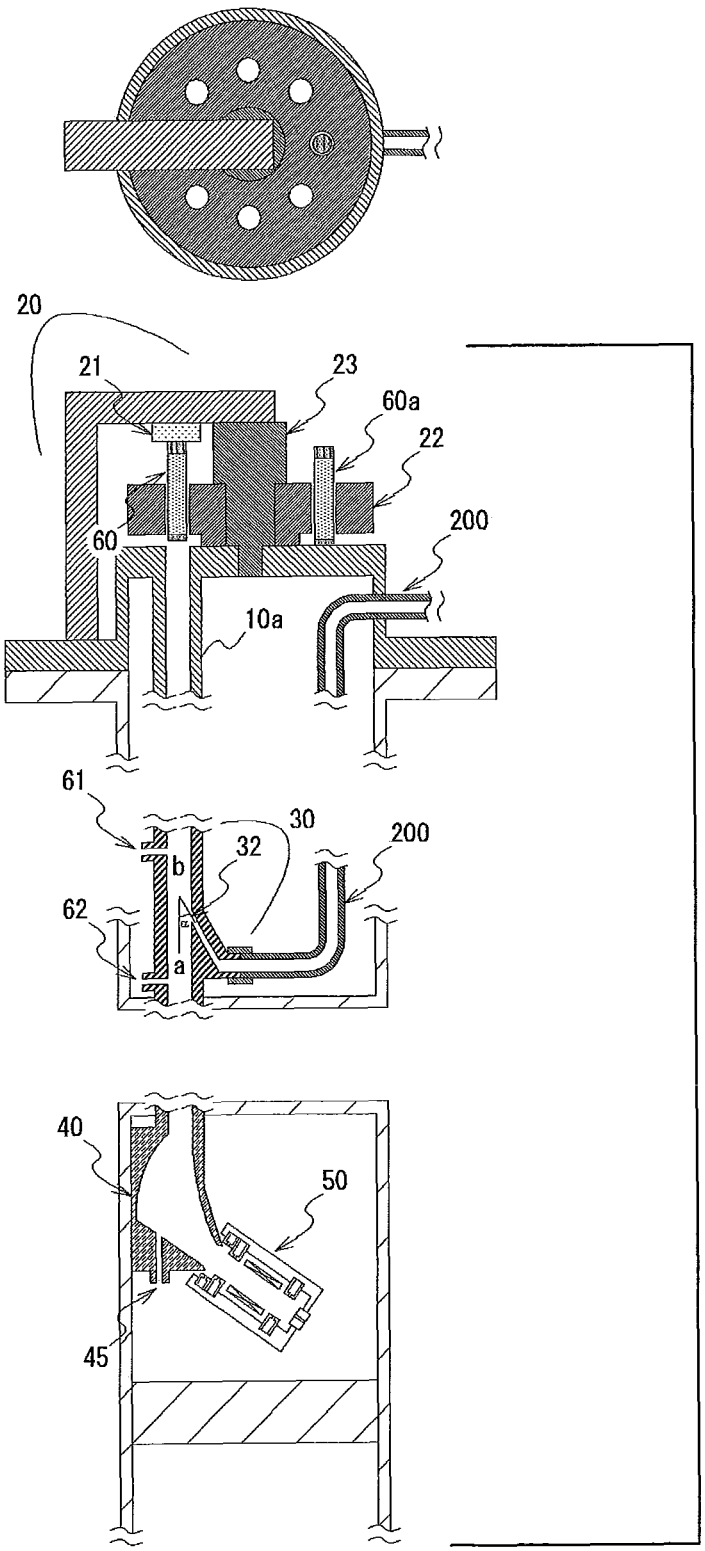

NMR PROBE

BACKGROUND OF THE INVENTION

1. Field of the Invention

The present invention relates to an NMR probe used when nuclear magnetic resonance (NMR) measurements are made. This NMR probe permits a sample tube to be introduced and ejected from the probe while the probe is kept mounted in a magnetic field generator. The sample tube is passed through a tubular sample tube passage between a sample tube insertion port and a sample tube support by a gas stream.

2. Description of Related Art

An NMR spectrometer is an analytical instrument for detecting a signal arising from atomic nuclei having spin magnetic moments by applying a static magnetic field to the nuclei to induce the spin magnetic moments to thereby produce a Larmor precession and irradiating the nuclei with RF waves having the same frequency as the precession to bring the nuclei into resonance.

In an NMR spectrum of a sample in solid phase, interactions (such as dipolar interactions which are nullified by rotational Brownian motion in a solution) manifest themselves directly and so the spectral linewidth broadens extremely, thus obscuring chemical shift terms. One of the methods which overcome this undesired phenomenon and give rise to sharp solid-state NMR spectra was discovered by E. R. Andrew in 1958 and is known as MAS (magic angle spinning). In this method, the sample tube is tilted at an angle of about 54.7° from the direction of the static magnetic field $B_0$ and spun at high speed. Thus, anisotropic interactions can be removed and chemical shift terms can be extracted.

An NMR probe for implementing the MAS method is hereinafter referred to as the MAS probe and subjected to NMR measurements by being inserted in a slot-like measurement space within a magnetic field generator typified by a superconducting magnet system. Generally, the magnetic field produced by a magnetic field generator is either parallel or perpendicular to the measurement space. A magnet producing the former type of magnetic field is known as a solenoid-type air-core magnet. A magnet producing the latter type of magnetic field is known as a split-type air-core magnet. On the other hand, in a MAS probe, a sample tube holding a sample therein is placed on an axis of rotation tilted relative to the magnetic field on a sample tube support. This sample tube support acts to support the sample tube during measurements and to accurately determine the posture and motion of the sample tube. The sample tube is allowed to be introduced and ejected only from a certain direction.

Therefore, under the condition where the MAS probe has been attached in the magnetic field generator, it is difficult to introduce a sample tube from outside a sample tube support having its axis of rotation tilted relative to the magnetic field. Accordingly, it is customary to remove the MAS probe from the magnetic field generator in order to introduce a sample tube into the sample tube support.

However, when the MAS probe is used, the magic angle needs to be accurately adjusted in advance by an NMR measurement employing a reference standard. When the MAS probe is installed to or detached from the magnetic field generator for exchange of the sample, the adjusted value deviates from its correct value. Therefore, the adjustment must be made each time. Such a mounting and detaching work must be done manually. This causes human errors. In addition, this greatly deteriorates the efficiency of NMR measurements.

In an attempt to solve these problems, top-loading type MAS probes have been proposed, for example, as shown in JP-UM-A-57-59356 and U.S. Pat. No. 7,282,919. A MAS probe of the top-loading type permits a sample tube to be loaded from outside of a magnetic field generator that is spaced from a sample tube support. With the MAS probe of the top-loading type, a sample can be exchanged without mounting or detaching the MAS probe to or from the magnetic field generator.

The structure of a solid-state NMR spectrometer including a top-loading type MAS probe is schematically shown in FIG. 1, the probe being indicated by numeral 3. In FIG. 1, a superconducting magnet 100 is composed of a heat-insulating container 1 for accommodating a refrigerant and a superconducting solenoid coil C that is maintained at low temperature by the refrigerant. The heat-insulating container is provided with a through-hole 2 extending through the coil C. In this way, access to the magnetic field is provided through the through-hole 2 being an access space that is a slot elongated in the direction of depth compared with the width.

Referring also to FIG. 2, the MAS probe 3 is inserted in the through-hole 2, and is composed of a sample tube support 50, a sample tube insertion port 20 formed in the upper end of the through-hole 2, a sample tube passage 10 connecting together the insertion port 20 and the tube support 50, and a direction converter 40 mounted at a non-end position in the sample tube passage 10. The outer periphery of a sample tube 60 (see FIG. 2) is supported by an accurate gas bearing within the sample tube support 50 and on an axis of rotation tilted relative to a static magnetic field H produced by the superconducting coil C. During measurements, the sample tube is spun at high speed.

FIG. 2 more particularly shows the structure of the MAS probe 3 shown in FIG. 1. In FIG. 2, a sample to be investigated is sealed in the sample tube 60 that is a roughly circular cylinder. The sample tube 60 having the sample sealed therein is inserted in the sample tube insertion port 20, transported to the sample tube support 50, and subjected to a measurement. After the measurement, the sample tube 60 is withdrawn from the sample tube support 50 and taken out of the sample tube insertion port 20.

The tubular sample tube passage 10 consisting of passage portions 10a and 10c extend between the sample tube insertion port 20 and the sample tube support 50 to connect together port 20 and tube support 50. The sample tube 60 can move between the sample tube insertion port 20 and the tube support 50 by moving substantially parallel to the axis of the cylindrical interior of the sample tube passage 10.

In order to introduce the sample tube 60 into the sample tube support 50 from the direction of axis of rotation, it is necessary to convert the direction of the axis of the cylindrical interior of the sample tube 60 that descends vertically from the sample tube insertion port 20 into a direction parallel to the axis of rotation of the sample tube support 50 to permit introduction into the sample tube support 50. For this purpose, the direction converter 40 is mounted near the sample tube support 50.

After undergoing a measurement, the sample tube 60 is expelled from the sample tube support 50 toward the sample tube insertion port 20 by gas flowing through the sample tube passage 10. The gas is supplied from a high-pressure gas generator 230 connected to the bottom of the sample tube support 50 via a pipe 200 under control of a valve 210.

During the ejection of the sample tube, the sample tube 60 is forced toward the direction converter 40 by the gas ejected from the bottom of the sample tube support 50. The direction converter 40 has a curved inner wall surface to change the direction of the sample tube 60. As the sample tube 60 enters the direction converter 40, the sample tube abuts against the curved inner wall surface of the converter 40 and, thus, the tube moves along the inner wall surface. Consequently, the direction of motion is changed into a perpendicular direction. Then, the sample tube 60 is raised to the position of the sample tube insertion port 20 by the gas pressure. During this process, a flow rate of gas sufficient to move the sample tube up to the sample tube insertion port 20 against gravity is supplied from the bottom of the sample tube support 50 via the valve 210.

On the other hand, when the sample tube 60 is introduced, it is moved from the sample tube insertion port 20 toward the sample tube support 50 mainly by gravity, the sample tube support 50 having a sample tube-spinning function as described later. To avoid the tube 60 from dropping abruptly, contrivances are adopted. For example, the sample tube 60 is floated by the gas pressure when the tube is inserted into the sample tube insertion port 20 and then the gas pressure is lowered gradually so that the tube descends slowly.

In this way, with the top-loading type MAS probe, the investigated sample can be exchanged while the probe is kept mounted in the magnetic field generator. This dispenses with readjustment of the probe concomitant with a sample exchange. Hence, the NMR spectrometer can be used efficiently. Furthermore, different samples can be continued to be measured while maintaining the sufficiently adjusted condition achieved using a reference standard and, therefore, accurate NMR spectra can be obtained easily.

With the conventional MAS probe as described above, the sample tube 60 is pushed out of the sample tube support with strong force during ejection of the sample tube. Therefore, the outer periphery of the sample tube 60 and the inner bearing of the sample tube support 50 are strongly rubbed against each other. This wears away the outer periphery of the sample tube 60 and the inner bearing of the sample tube support 50. Generally, a gas bearing fabricated to an accuracy of the order of micrometers is used as the bearing of the sample tube support 50. If the bearing is worn slightly, the performance of the sample tube support 50 will deteriorate.

Similarly, when the sample tube 60 is ejected, the sample tube 60 violently collides against the inner wall of the direction converter 40. The direction of the tube is then converted by motion bound to the inner wall, i.e., while pressed against the wall. Because of the collision and friction occurring at this time, the outer periphery of the sample tube 60, especially the turbine blades for driving the MAS probe 3, is damaged or greatly worn away, resulting in a decrease in the lifetime of the tube. If the sample tube 60 is worn, the MAS probe 3 will malfunction. When the sample tube 60 is inserted or withdrawn, the sample tube passage 10 will be clogged up.

For instance, the turbine blades of a sample tube 60 of a complex shape as shown in JP-A-2003-177172 show excellent aerodynamic performance in realizing high-speed spinning, but the mechanical strength is low because the complex and delicate structure of the curved turbine blades is exposed from the outside of the sample tube 60. A sample tube 60 having such turbine blades is subject to damage and wear in the conventional MAS probe 3 and has been difficult to use in practical applications.

Furthermore, the aforementioned collision and wear will wear away the inner wall of the direction converter 40, resulting in troubles.

SUMMARY OF THE INVENTION

In view of the foregoing, it is an object of the present invention to provide an NMR probe which is for use with a sample tube in such a way that the internal components of the probe and the sample tube are less susceptible to damage and wear than conventional and which permits sample exchange to be done stably and repetitively over long periods of time.

This object is achieved in accordance with the teachings of the present invention by providing an NMR probe permitting a sample tube to be inserted and withdrawn while the probe is kept mounted in a magnetic field generator. The NMR probe has a sample tube insertion port through which the sample tube is inserted into and withdrawn from the probe, a sample tube support that supports the sample tube during NMR measurements, a tubular sample tube passage connecting together the sample tube insertion port and the sample tube support and permitting the sample tube to be conveyed therebetween, and a gas stream generator for producing a gas stream in the sample tube passage to convey the sample tube between the sample tube insertion port and the sample tube support. The gas stream generator is mounted at an intermediate (non-end) position in the sample tube passage.

In one feature of the invention, the magnetic field generator is a superconducting magnet having an access space in the form of an elongated slot. The sample tube support is a MAS device adapted for solid-state NMR measurements and has a direction converter at a non-end position in the sample tube passage to convert the direction of transport of the sample tube. The gas stream generator is mounted at a non-end position in the sample tube passage between the sample tube insertion port and the direction converter and located physically closer to the sample tube support than the midway point of the sample tube passage.

In another feature of the invention, the direction converter is provided with a gas port having an inside diameter smaller than the inside diameter of the sample tube passage. The gas port permits ejection of gas to urge the sample tube to change its direction in response to the operation of the gas stream generator.

In a yet other feature of the invention, the gas stream generator is made of means for ejecting gas into the tubular passage toward the sample tube insertion port from a gas port having an inside diameter smaller than the inside diameter of the sample tube passage.

In an additional feature of the invention, the gas port defines a gas injection angle lying in a range of 10° to 30° relative to the direction of the axis of a portion of the sample tube passage defusing the gas port. The diameter of the gas port is in a range of 1/10 to 1/3 of the inside diameter of the sample tube passage.

In a still other feature of the invention, pressure gauges for detecting the pressure inside the sample tube passage are connected to the sample tube passage at positions close to ends of the gas stream generator which face the sample tube insertion port and the sample tube support, respectively.

In a yet additional feature of the invention, a gas port permitting the gas to escape to the outside from inside the sample tube passage is formed in the sample passage at a position close to an end of the gas stream generator which faces the sample tube insertion port. There is further provided a valve for adjusting the flow rate of the escaping gas.

In a still further feature of the invention, the sample tube support includes a reflection type optical detection system for detecting the angular position of the sample tube. The optical detection system is located such that the sample tube is interposed in the optical detection system on an extension to the direction along which light is emitted from the optical detection system to detect the presence or absence of the sample tube in the sample tube support.

The NMR probe according to the present invention enables a sample tube to be set or exchanged while the probe is kept installed in the magnetic field generator. The NMR probe has the sample tube insertion port for inserting and withdrawing the sample tube into and from the probe, the sample tube support for supporting the sample tube during NMR measurements, the tubular sample tube passage connecting together the sample tube insertion port and the sample tube support and permitting the sample tube to be conveyed between the insertion port and the sample tube support, and the gas stream generator for producing a gas stream in the sample tube passage to move the tube between the sample tube insertion port and the sample tube support. Since the gas stream generator is mounted at the non-end position in the sample tube passage, damage and wear to the insides of the sample tube and NMR probe are reduced. The NMR probe permits sample exchange to be done stably and repetitively over long periods of time.

Assuming that the gas stream generator does not hinder movement of the sample tube, the gas stream generator is mounted at a non-end position in the sample tube passage and forms a part of the sample tube passage. Since the gas stream generator is mounted at a non-end position in the sample tube passage in this way, the flow rate of the gas flowing through the sample tube passage can be made different between the upstream side and the downstream side of the gas stream generator. Also, the force (hereinafter may be referred to as the driving force) with which the sample tube is moved can be made different between these two regions. That is, there is a positive correlation relationship between the driving force and the stream velocity or flow rate of the gas. Therefore, the driving force A acting between the gas stream generator and the sample tube support (region A) and the driving force B acting between the gas stream generator and the sample tube insertion port (region B) can be set separately.

The operation of the gas stream generator, when the sample tube installed in the sample tube support is conveyed into the sample tube insertion port, is described below. The stream generator produces a gas stream directed from the sample tube support toward the sample tube insertion port. Inside the sample tube passage, the pressure is negative on the upstream side A (region A). The pressure is positive on the downstream side B (region B). Gas flowing through the region A is supplied from the atmospheric pressure through a ventilation port formed in the bottom of the sample tube support. Because of the negative pressure, there is a limitation on the maximum amount of gas taken in from the atmospheric pressure as a matter of course and so the upper limit of the driving force A is restricted. Therefore, in the inventive configuration, the possibility that the driving force A becomes excessive due to a fault or for other cause to thereby damage or wear the sample tube and sample tube passage is low.

The driving force A is set to a relatively small value sufficient to expel the sample tube from the sample tube support to the gas stream generator. The driving force B is set to a relatively large value sufficient to convey the tube from the gas stream generator to the sample tube insertion port against the action of gravity. Consequently, the damage and wear of the insides of the sample tube and NMR probe are reduced. At the same time, the sample tube can be transported into the sample tube insertion port reliably. This effect appears more conspicuously by mounting the gas stream generator closer to the sample tube support, i.e., by making the driving force A smaller and the driving force B greater.

Superconducting magnets often used for NMR measurements have an access space in the form of an elongated slot having a great depth compared with its width. A space in which a strong magnetic field necessary for NMR measurements is produced is located at the depth of the space in the form of an elongated slot. Therefore, the sample tube passage is longer than the sample tube. That is, the sample tube passage is at least twice as long as the sample tube. Typically, for example, in the case of a sample tube having an outside diameter of 4 mm, the former length is 10 to 100 times as large as the latter length. The ratio may be in excess of this range and do not see its maximum value depending on the combination of the sample tube and the magnet producing the magnetic field. In this system, the required ratio of the driving force B to the driving force A is inevitably high and, hence, the advantageous effects of the present invention are increased. Thus, the gas stream generator is preferably located closer to the sample tube support. Desirably, the gas stream generator is located physically closer to the sample tube support than the midway point of the passage line between the sample tube insertion port and the direction converter. Where there is a great difference in height between the sample tube insertion port and the direction converter, i.e., when a force acting against gravity is exerted, the gas stream generator is preferably located closer to the sample tube support than the midway point of the height difference.

Where the NMR probe has the direction converter, various types of wear inside this direction converter present problems. Therefore, the gas stream generator is preferably located closest to the direction converter between the direction converter and the sample tube insertion port. The direction converter forms a part of the sample tube passage. Although the details of the present invention have been described while taking the case where the sample tube support is mainly a MAS device as one example, the sample tube support of the invention is not restricted to MAS devices. The present invention can be applied to an apparatus where damages and wears of sample tube, sample tube passage, and sample tube support are problematic such as when the sample tube is ejected from the sample tube support by a gas stream or passes through the direction converter.

BRIEF DESCRIPTION OF THE DRAWINGS

FIG. 5A is an enlarged top view and FIG. 5B is an enlarged exploded side view of the top-loading type MAS probe shown in FIG. 4.

DESCRIPTION OF THE PREFERRED EMBODIMENTS

The preferred embodiments of the present invention are hereinafter described with reference to the drawings.

Embodiment 1

Figure 1:
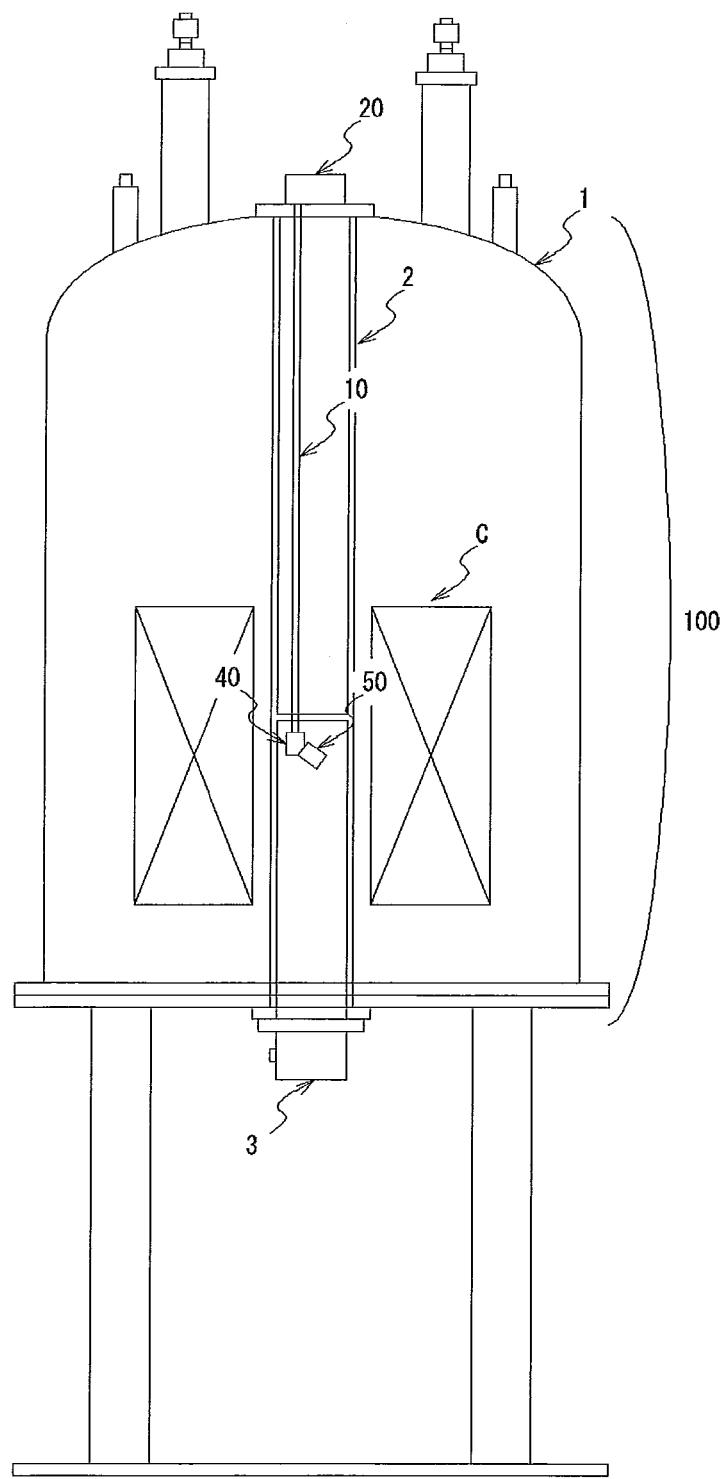
FIG. 1 is a vertical cross section of a conventional solid-state NMR spectrometer.
Figure 2:
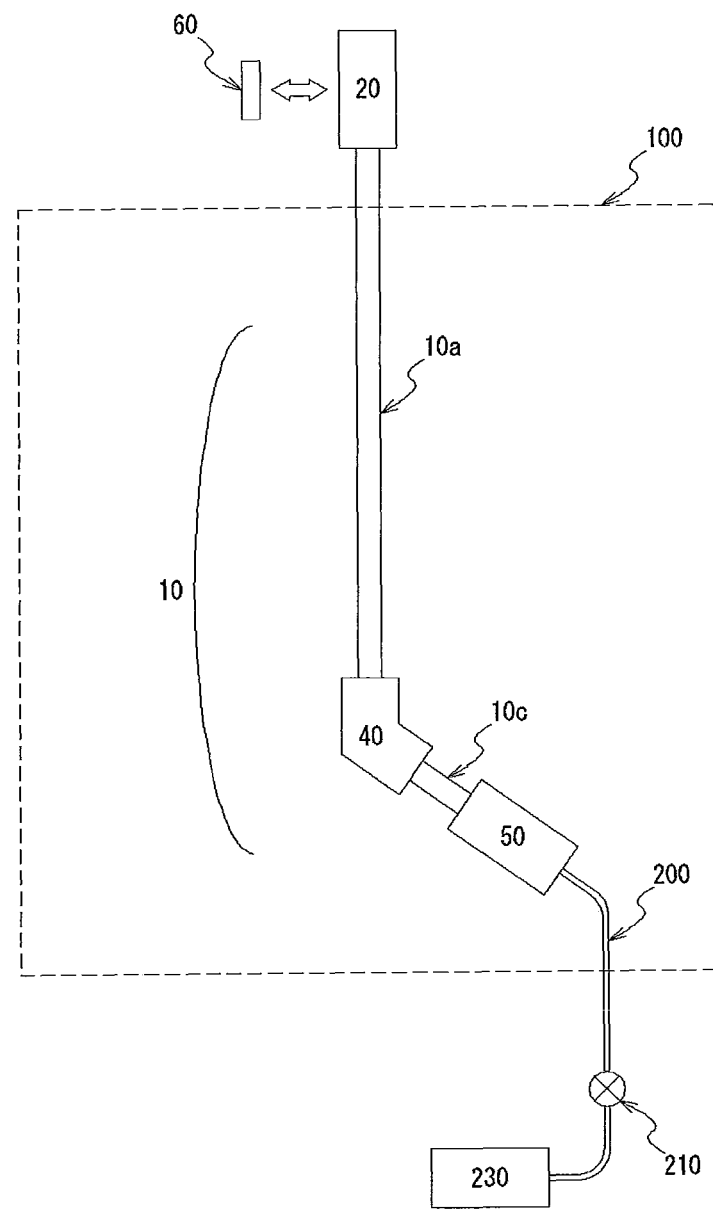
FIG. 2 is a front elevation of a conventional top-loading type MAS probe.
Figure 3:
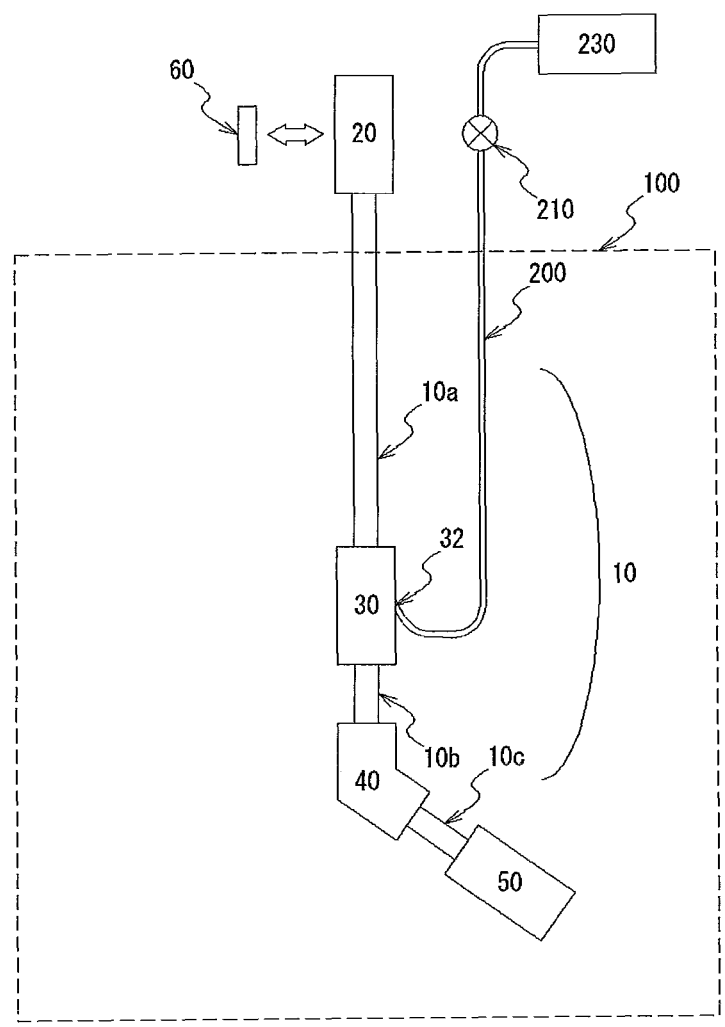
FIG. 3 is a front elevation of a top-loading type MAS probe according to the present invention.

FIG. 3 shows one example of the MAS probe according to the present invention. In FIG. 3, a sample to be investigated is sealed in a substantially cylindrical sample tube 60. The sample tube 60 having the sample sealed therein is inserted into a sample tube insertion port 20 and conveyed to a sample tube support 50. The sample tube 60 undergone a measurement is returned from the sample tube support 50 and taken out of the sample tube insertion port 20.

The sample tube insertion port 20 and the sample tube support 50 are interconnected by a sample tube passage 10 having passage portions 10a, 10b, and 10c. The sample tube 60 can be moved between the insertion port 20 and the sample tube support 50 by moving through the passage 10 substantially parallel to the axis of the cylindrical interior of the sample tube passage 10.

The sample tube support 50 is designed so that the sample tube can be spun at high speed on an axis tilted at an angle of about 54.7° relative to a vertical line extending from the sample tube insertion port 20.

In order to introduce the sample tube 60 into the sample tube support 50, it is necessary to convert the direction of the axis of the cylindrical interior of the sample tube 60 descending vertically from the sample tube insertion port 20 into a direction parallel to the axis of rotation of the sample tube support 50 for introduction into the support 50. Therefore, the direction converter 40 is mounted near the sample tube support 50. Their center-to-center distance is about 0.02 m.

Let L1 be the center-to-center distance between the direction converter and the sample tube insertion port, taken along the path of motion of the tube. Let L2 be the center-to-center distance between the direction converter and the MAS device (sample tube support 50), taken along the path of motion of the tube. Generally, the distance L1 is one or more orders of magnitude greater than the distance L2.

In particular, as an example, ECA500, an NMR spectrometer, manufactured by JEOL Ltd. has a magnetic field strength of 11.7 T and the distances L1 and L2 of 1 m and 0.02 m, respectively. In this design, in order to move a sample tube from the direction converter into the sample tube insertion port, the tube must be raised vertically over as long as 1 m against the action of gravity. Therefore, the force F1 needed to move the sample tube from the direction converter into the sample tube insertion port is at least ten times as large as the force F2 needed to move the sample tube from the MAS device to the direction converter.

Similarly, ECA930, an NMR spectrometer, manufactured by JEOL Ltd. has a magnetic field strength of 21.8 T, the distance L1 of 2.5 m, and the distance L2 of 0.02 m. As the magnetic field strength is increased and the magnet is increased in size in this way, the distance L1 increases but the distance L2 remains almost constant. Therefore, the ratio of L1 to L2 varies greatly depending on instrument.

In the present invention, a novel gas stream generator 30 is mounted between the sample tube passage portions 10a and 10b. High-pressure gas is supplied into the gas stream generator 30 via the high-pressure gas generator 230, the valve 210, and the gas pipe 200. The gas generator 230 is composed of a compressed gas cylinder, a gas tank, a compressor, a pressure-reducing valve, and a flow-adjusting valve.

The gas stream generator 30 is mounted near the direction converter 40 between the direction converter 40 and the sample tube insertion port 20. Generally, the center-to-center distance between the gas stream generator 30 and the direction converter 40 is within 0.1 m. The gas stream generator 30 forms a part of the sample tube passage 10. This sample tube passage 10 includes a main pipe and a branch pipe 32 connected to the main pipe. The branch pipe 32 has a gas ejection port having an inside diameter that is approximately equal to or less than a half of the inside diameter of the main pipe. Preferably, the inside diameter of the branch pipe 32 is about one-tenth to one-third of the inside diameter of the main pipe from the point of view of ejection efficiency.

The angular position of the branch pipe 32 relative to the longitudinal direction of the main pipe is so set that gas is ejected toward the sample tube insertion port 20 (from a to b (see FIG. 5B)). The angle α made between the main pipe and the branch pipe must be approximately 45 degrees or less. If the angle α is greater than 45 degrees, the efficiency at which gas is forced through the sample tube passage will deteriorate greatly with undesirable results. If the angle α lies in the range of from about 10 to 30 degrees, a good efficiency is obtained.

If gas is ejected from the branch pipe, the inertia generates a gas stream toward the sample tube insertion port within the main pipe of the sample tube passage. The gas ejected at high speed produces a local negative pressure due to the Bernoulli's effect. As a result, surrounding gas is sucked. That is, the gas stream generator draws in gas from the upstream side a and ejects it toward the downstream side b and, thus, operates like a pump. On the upstream side a, a negative pressure is produced by the pumping action.

The ratio of the drawing force to the ejection force can be adjusted by adjusting the angle of the branch pipe relative to the main pipe of the sample tube passage. This ratio can also be adjusted by adjusting the ratio of the inside diameter of the main pipe to the inside diameter of the branch pipe.

Generally, air is used as the high-pressure gas. Depending on measurement, a certain type of gas matching the purpose, such as nitrogen or helium, may be used.

The gas pipe 200 withstands pressures of about 0 to 0.5 MPa (absolute pressure). Preferably, the gas pipe is made of high pressure proof urethane pipe.

When the sample tube is ejected after the end of a measurement, the sample tube 60 is moved from the sample tube support 50 toward the sample tube insertion port 20 by a gas stream produced inside the sample tube passage 10 by the gas stream generator 30.

In the present embodiment, the gas stream generator 30 is placed between the sample tube insertion port 20 and the sample tube support 50 and ejects gas toward the sample tube insertion port 20. Therefore, the flow rate of the gas driving the sample tube 60 varies suddenly across the gas stream generator 30. That is, the driving force exerted between the sample tube insertion port 20 and the gas stream generator 30 can be set much greater than the driving force exerted between the sample tube support 50 and the gas stream generator 30.

The sample tube 60 can be driven by a minimum flow rate of gas capable of moving the sample tube 60 from the sample tube support 50 to the gas stream generator 30. Consequently, the tube 60 is prevented from being pressed against the inner walls of the passage and other device components in the sample tube support 50 and in the direction converter 40 and, thus, the tube 60 does not easily wear away. Furthermore, a large flow rate of air can be supplied from the gas stream generator 30 into the space between the gas stream generator 30 and the sample tube insertion port 20 and, so if the passage portion 10a is long, the sample tube 60 can be stably raised to the position of the sample tube insertion port 20.

On the other hand, when the sample is introduced prior to a measurement, the sample tube 60 is moved from the sample tube insertion port 20 toward the sample tube support 50 mainly by gravity. To avoid the tube from dropping rapidly, the sample tube 60 may be floated by gas pressure when the tube is inserted into the sample tube insertion port 20 and then the gas pressure may be gradually lowered such that the tube descends slowly.

However, according to the need, a second gas stream generator permitting descending motion of the sample tube 60 may be added. In this case, the sample tube 60 is actively lowered such that the sample can be introduced into the sample tube support 50 without relying on gravity.

In this way, in the top-loading type MAS probe of the present embodiment, the sample tube 60 can be smoothly exchanged while the MAS probe is kept mounted in the magnetic field generator. Consequently, sample exchange can be done repetitively and stably over long periods of time.

The present embodiment was applied to ECA500, an NMR spectrometer, manufactured by JEOL Ltd. in which the sample tube had an outside diameter of 4 mm and the distance L1 between the direction converter and the sample tube insertion port was 1 m. The following structure was used. It was confirmed that the spectrometer operated well. The inside diameter of the main pipe of the sample tube passage was set to 4.2 mm. The branch pipe was mounted at an angle (a) of 20 degrees. The inside diameter of the gas ejection port of the branch pipe was set to 1.2 mm. The gas stream generator of the present embodiment is characterized in that there is no mechanical part in the NMR probe and so the probe is not susceptible to malfunction and faults. With respect to flow rate, the flow rate on the upstream side (on the side of the sample tube support 50) is always higher, in principle, than the flow rate on the downstream side (on the side of the sample tube insertion portion 20). Furthermore, the flow rate on the downstream side is given by the amount of air taken in from the atmosphere near the sample tube support and naturally has its maximum value. Therefore, it is unlikely that an excessive driving force will be applied to the upstream side due to a malfunction. In addition, during operation, what is controlled from the outside is only the flow rate of supplied gas and, thus, is easy to control the NMR probe.

Embodiment 2

Figure 4:
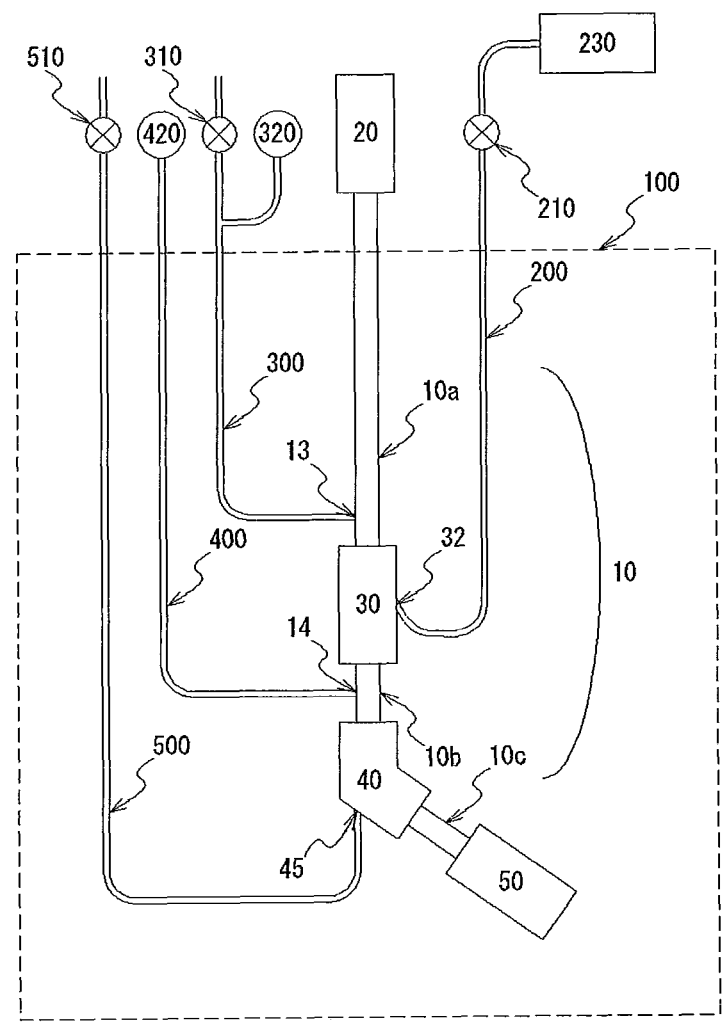
FIG. 4 is a front elevation of another top-loading type MAS probe according to the present invention.

FIG. 4 shows another NMR probe according to the present invention. FIGS. 5A and 5B show enlarged views (top view and cross sections) of parts of the NMR probe. In both FIGS. 3 and 4, like components are indicated by like reference numerals.

The present embodiment is similar to the embodiment illustrated in FIG. 3 except that gas ports 13 and 14 having a small diameter permitting gas to flow at a low flow rate are formed respectively ahead of and behind the gas stream generator 30, the flow rate being so set that passage of the sample tube 60 through the sample tube passage 10 is not hindered. The gas ports 13 and 14 also permit measurement of the gas pressure. The gas ports 13 and 14 may be formed in the gas stream generator 30 itself.

The gas ports 13 and 14 are in communication with gas pipes 300 and 400, respectively, which can withstand pressures of 0 to 0.5 MPa (absolute pressure). Preferably, each gas pipe is made of a high pressure proof urethane tube. Pressure gauges 320 and 420 are connected to the gas pipes 300 and 400, respectively.

The operative condition of the MAS probe (such as the position of the sample tube) can be known from pressure values indicated by the pressure gauges 320 and 420. In consequence, the danger that the sample tube will be damaged by operating the MAS probe in an unreasonable manner, for example, when the sample tube is clogged up, is reduced. Furthermore, when the sample tube 60 is placed in position within the sample tube support 50, if the sample tube 60 is further fed in and there is a malfunction, the danger that the sample tube 60 will be damaged is reduced.

For example, when the gas stream generator 30 is in operation, let P1a and P1b be pressures indicated by the pressure gauges 320 and 420, respectively, when the sample tube 60 is in a given position within the sample tube insertion port 20. Let P2a and P2b be pressures indicated by the pressure gauges 320 and 420, respectively, when the gas stream generator 30 is in operation and the sample tube 60 does not exist.

Let P3a and P3b be pressures indicated by the pressure gauges 320 and 420, respectively, when the gas stream generator 30 is in operation and the sample tube (not shown) has clogged the sample tube support 50. Let P4a and P4b be pressures indicated by the pressure gauges 320 and 420, respectively, when the gas stream generator 30 is in operation and the sample tube 60 has clogged the sample tube insertion port 20.

These pressures satisfy the following relationships: P4a>P1a≅P3a>P2a and P4b>P1b>P2b>P3b. That is, when the gas stream generator 30 is in operation, if a pressure indicated by the pressure gauge 420 is significantly smaller than the pressure P2b, then it is determined that the sample tube support 50 is clogged up with the sample tube 60. Furthermore, if a pressure indicated by the pressure gauge 420 is significantly greater than the pressure P1b, it is determined that the sample tube 60 has clogged the sample tube insertion port 20. In this way, the operative condition of the whole MAS probe 3 can be easily grasped using the pressure gauges mounted at given positions.

With the top-loading type MAS probe, the sample tube 60 set in the sample tube support 50 cannot be visually checked and so it is necessary to monitor the operative condition of the probe by some method or other. If the sample tube 60 is not in position within the sample tube support 50, and if gas is supplied into the sample tube support 50 to activate the MAS probe 3, the sample tube 60 would start to make unexpected motion in the sample tube passage 10, causing damage and wear.

In order to take the sample tube 60 out of the sample tube support 50, it is necessary to convert the direction of axis of rotation of the sample tube support 50 into a direction parallel to the vertical axis extending from the sample tube insertion port 20. For this purpose, the direction converter 40 is mounted near the sample tube support 50 capable of spinning the sample tube. Their center-to-center distance is approximately 0.02 m.

Figures 6A, 6B, 6C, 6D, 6E, 6F, 6G:
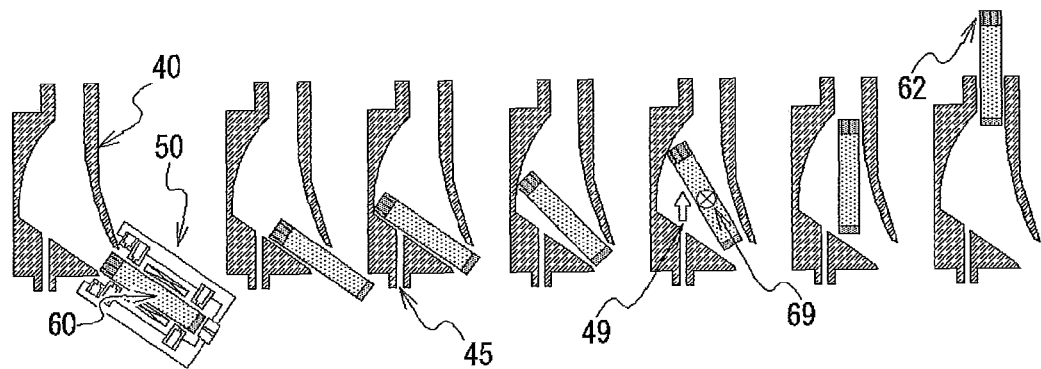
FIGS. 6A to 6G show examples of a direction converter according to the invention as the sample holder is removed from the tube support and transporter via the direction converter.

The direction converter 40 has an inner portion (FIG. 6C) having a length capable of accommodating the sample tube 60 in a direction parallel to the axis of the sample tube support 50 and another inner portion (FIG. 6F) having a length capable of accommodating the sample tube 60 in a direction parallel to the axis of the MAS probe 3. Obviously, the angle made between the axes of these two inner portions is about 54.7°. The converter has a space that is wide laterally of the sample tube passage 10 for direction conversion to permit the sample tube 60 to be converted in posture between these two states. The direction converter 40 is mounted near the sample tube support 50. Generally, their central-to-central distance is about 0.02 m.

In the present embodiment, a gas port 45 is formed in the direction converter 40 to eject gas, which is supplied via a gas pipe 500 and a valve 510, in the axial direction of the gas stream generator 30 (i.e., in the direction in which the sample tube 60 is taken out). If the pressure in the regions inside the sample tube passage 10 which are close to the gas port 45 becomes negative because of the operation of the gas stream generator 30, the gas is inhaled from the atmospheric pressure and ejected from the gas port 45. In this way, the gas port 45 cooperates with the gas stream generator 30. The ejected gas imparts a rotation moment to the sample tube 60, thus converting the direction of the sample tube 60 to the direction of the gas stream generator 30. This is depicted in the enlarged views of FIGS. 6A to 6G.

The valve 510 is normally open. The flow rate of gas ejecting from the gas port 45 is adjusted by appropriately adjusting the degree of opening of the valve 510. When the operation of the gas port 45 is nullified, the valve 510 is fully closed.

As a result, the sample tube 60 which has smoothly passed through the direction converter 40 also passes through the gas stream generator 30 while maintaining its impetus. After passing through the gas stream generator 30, the sample tube 60 is raised to the position of the sample tube insertion port 20 mainly by the force of the gas supplied from the gas stream generator 30.

As shown in the first figure as viewed from the top of FIG. 5B, in the sample tube insertion port 20, gas ejected from the sample tube passage 10 flows upwardly and strikes the sample tube to thereby halt the tube at a given position in the sample tube insertion port 20.

A valve 310 mounted in the gas pipe 300 is normally closed. This valve 310 permits the gas from the gas stream generator 30 to escape. Consequently, the operation of the gas stream generator 30 is effective only in the vicinity of the gas port 13 to which the pipe 300 is connected to hold the sample tube 60 temporarily at a non-end position of the sample tube passage 10a. This can prevent the sample tube 60 from entering the direction converter 40 at an excessively high speed.

Figure 7A:
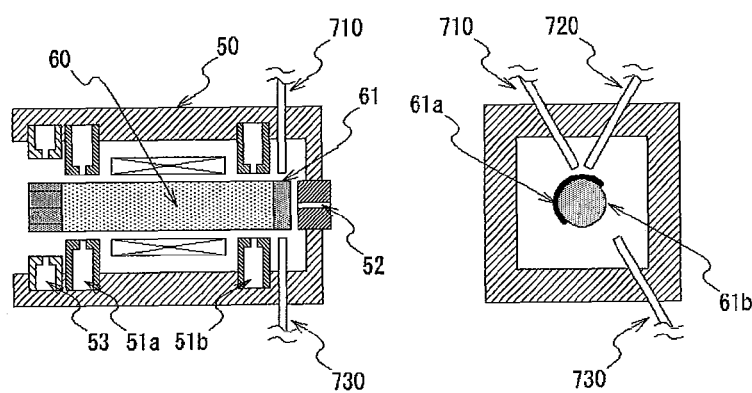
FIGS. 7A and 7B show examples of sample tube-rotating portion according to the invention.
Figure 7B:
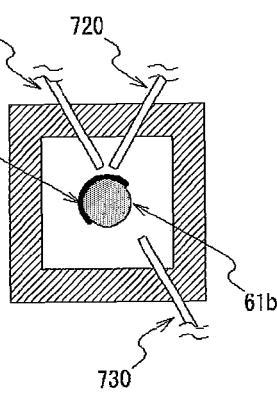

FIGS. 7A and 7B show examples of the sample tube support 50 used in the present embodiment. FIG. 7A is a cross-sectional view of the sample tube support 50, taken along a plane including the axis of rotation of the sample tube 60. FIG. 7B is a cross-sectional view of the sample tube support 50, taken along a plane perpendicular to the axis of rotation of the sample tube 60.

In FIG. 7A, journal gas bearings 51a and 51b are spaced at regular intervals circumferentially of the sample tube 60. A thrust gas bearing 52 is mounted in the direction of axis of rotation of the sample tube 60. These bearings act as bearings for the sample tube 60 by ejecting high-pressure gas from small holes. A thin gold film is deposited on the thrust bearing side of the sample tube 60 to form a sample tube outer periphery portion 61.

Turbine blades of a turbine are mounted on the opposite sides of the sample tube 60 from the thrust bearings. A stator 53 is mounted to drive the turbine. The stator 53 drives the turbine of the sample tube 60 by ejecting high-pressure gas in a given direction from small holes.

In FIG. 7B, the thin gold film is indicated by 61a and deposited to cover a circumferential half of the outer periphery portion 61 of the sample tube 60. As the sample tube 60 rotates, the gold deposited surface portion 61a and the non-deposited surface portion 61b are alternately interchanged in position. If light is emitted using one optical fiber 710, and if the reflected light is received using another optical fiber 720, the intensity of light received at the optical fiber 720 varies in synchronism with the rotation of the sample tube 60. The rotational speed of the sample tube 60 can be detected by measuring the period of the variation of the intensity of the received light.

The fibers 710 and 720 are known in the conventional art. In the present embodiment, a novel optical fiber 730 is mounted substantially on an extension to the optical fiber 710. The positional relationship is so set that if the sample tube 60 is not in position, light exiting from the optical fiber 710 enters the optical fiber 730. As a result, the presence or absence of the sample tube 60 can be detected by the presence or absence of light incident on the optical fiber 730.

Consequently, for example, if the sample tube 60 has clogged the passage, the danger that the sample tube 60 will be damaged by driving the probe coercively is reduced. In addition, this reduces the danger that the sample tube 60 will be damaged by feeding the sample tube 60 further into the sample tube support 50 when the tube 60 is already in position and causing a malfunction.

Furthermore, where a flowmeter is installed in the flow line for the gas supplied into the gas bearings for the sample tube support 50, if the sample tube 60 gets out of position during operation of the sample tube support 50, the deviation can be detected as a flow rate change. Generally, there is a tendency that the deviation will result in a flow rate increase. Consequently, the operational state of the sample tube support 50 can be monitored at all times.

In this way, in the top-loading type MAS probe of the present embodiment, the sample tube 60 can be taken out by converting its posture smoothly from a direction parallel to the axis of rotation of the sample tube support 50 into the direction of the sample tube insertion port 20. This enables a sample exchange operation to be effected safely.

According to the present invention, damage and wear of the sample tube are suppressed and so a sample tube of high performance having turbine blades of complex shape as shown in JP-A-2003-177172 can be used in a top-loading type MAS probe.

The present invention can be applied extensively to solid-state NMR spectroscopy.

Having thus described our invention with the detail and particularity required by the Patent Laws, what is desired protected by Letters Patent is set forth in the following claims.

The invention claimed is:

1. An NMR probe for use with a sample tube which can be introduced into and withdrawn from the probe while the probe is kept mounted in a magnetic field generator, said NMR probe comprising:
   a sample tube insertion port through which the sample tube is inserted into and withdrawn from the NMR probe;
   a sample tube support that supports the sample tube during NMR measurements;
   a tubular sample tube passage connecting together the sample tube insertion port and the sample tube support and permitting the sample tube to be conveyed therebetween;
   a gas stream generator for producing a gas stream in the sample tube passage to convey the sample tube between the sample tube support and the sample tube insertion port, the gas stream generator being mounted at an intermediate position in the sample tube passage,
   wherein said gas stream generator has means for ejecting gas into said tubular passage directed toward the sample tube insertion port from a gas port at an intermediate position in the sample tube passage and having an inside diameter smaller than the inside diameter of the sample tube passage.

2. An NMR probe as set forth in claim 1, wherein
   said magnetic field generator is a superconducting magnet having an access space in the form of an elongated slot,
   said sample tube support is a MAS device adapted for solid-state NMR measurements,
   a direction converter for converting the direction of transport of the sample tube is mounted at a non-end position in the sample tube passage, and
   said gas stream generator is mounted at an intermediate position in the sample tube passage between the sample tube insertion port and the direction converter and located physically closer to the sample tube support than the midway point of the sample tube passage.

3. An NMR probe as set forth in claim 2, wherein a gas port having an inside diameter smaller than the inside diameter of said sample tube passage is formed in said direction converter to eject gas toward the sample tube in response to operation of the gas stream generator such that the sample tube is urged to change its direction.

4. An NMR probe as set forth in claim 3, wherein said gas port defines a gas ejection angle lying in a range of 10° to 30° relative to the direction of the axis of a portion of the sample tube passage defining the gas port, and wherein the gas port has a diameter lying in a range of $1/10$ to $1/3$ of the inside diameter of the sample tube passage.

5. An NMR probe as set forth in any one of claims 1 to 3, wherein pressure gauges for detecting the pressure inside the sample tube passage are connected to said sample tube passage at positions close to ends of the gas stream generator which face the sample tube insertion port and the sample tube support, respectively.

6. An NMR probe as set forth in any one of claims 1 to 3, wherein a gas port permitting the gas to escape to the outside from inside the sample tube passage is formed in the sample passage at a position close to an end of the gas stream generator which faces the sample tube insertion port, and wherein there is further provided a valve for adjusting the flow rate of the escaping gas.

7. An NMR probe as set forth in any one of claims 1 to 3, wherein said sample tube support has a reflection type optical detection system for detecting the angular position of the sample tube, and wherein the optical detection system is located such that the sample tube is interposed in the optical detection system on an extension to the direction along which light is emitted from the optical detection system to detect the presence or absence of the sample tube in the sample tube support.

* * * * *